United States Patent [19]

Matsushima et al.

[11] Patent Number: 4,731,641

[45] Date of Patent: Mar. 15, 1988

[54] AVALANCHE PHOTO DIODE WITH QUANTUM WELL LAYER

[75] Inventors: Yuichi Matsushima, Tokorozawa; Kazuo Sakai, Tokyo; Yukitoshi Kushiro, Tokyo; Shigeyuki Akiba, Tokyo; Yukio Noda, Yokohama; Katsuyuki Utaka, Musashino, all of

[73] Assignee: Kokusai Denshin Denwa Kabushiki Kaisha, Tokyo, Japan

[21] Appl. No.: 892,479

[22] Filed: Aug. 5, 1986

Related U.S. Application Data

[63] Continuation of Ser. No. 433,105, Oct. 6, 1982, abandoned.

[30] Foreign Application Priority Data

Oct. 7, 1981 [JP] Japan .................. 56-159967

[51] Int. Cl.$^4$ .................. H01L 29/201; H01L 31/08; H01L 27/14
[52] U.S. Cl. .................. 357/30; 357/4; 357/16
[58] Field of Search .................. 357/30 A, 30 R, 16, 357/4 SL

[56] References Cited

U.S. PATENT DOCUMENTS

| | | | |
|---|---|---|---|
| 4,127,862 | 11/1978 | Ilegems et al. | 357/16 |
| 4,348,686 | 9/1982 | Esaki et al. | 357/16 |
| 4,383,269 | 5/1983 | Capasso | 357/16 |
| 4,390,889 | 6/1983 | Capasso et al. | 357/16 |
| 4,439,782 | 3/1984 | Holonyak | 357/17 |
| 4,450,463 | 5/1964 | Chin | 357/16 |
| 4,473,835 | 9/1984 | Forrest et al. | 357/16 |

OTHER PUBLICATIONS

Capasso et al, "The Superlattice . . . Ratio", 7–9 Dec. 81, *Conference: IDEM,* Wash., D.C., pp. 284–287.
*Elec. Lts.,* 5 Jun. 1980, vol. 16. No. 12, "Impact Ionization . . . ", Chin et al., pp. 467–469.

*Primary Examiner*—Andrew J. James
*Assistant Examiner*—Jerome Jackson
*Attorney, Agent, or Firm*—Emmanuel J. Lobato; Robert E. Burns

[57] ABSTRACT

An avalanche photodiode with a quantum well layer in which a thin film, periodic multilayer structure composed of two different semiconductors is formed in a carrier multiplying region, the effective ionization coefficient ratio of carriers is raised by a quantum well layer formed by the thin film, multilayer periodic structure, and only electrons of large ionization coefficient are injected into the multiplying region, thereby to reduce noise in the APD.

4 Claims, 4 Drawing Figures

AVALANCHE PHOTO DIODE WITH QUANTUM WELL LAYER

This is a continuation of application Ser. No. 433,105, filed Oct. 6, 1982, now abandoned.

BACKGROUND OF THE INVENTION

The present invention relates to reduction of noise in an avalanche photodiode (hereinafter referred to as the "APD") for use in optical communication equipments or the like.

In the APD, carriers excited by incident light are accelerated and multiplied by a high intensity electric field emanating from a pn junction but, due to fluctuation in this course of amplification, excess multiplication noise is produced. It is known that, letting the inonization coefficients of electrons and holes be represented by $\alpha$ and $\beta$, respectively, and assuming that the ratio therebetween is $k=\alpha/\beta$ or $\beta/\alpha$, an excess noise factor decreases in proportion to the ratio k. Accordingly, in order to obtain an APD of low noise, it is necessary that the carriers of the larger ionization coefficient be injected into a material of a large ionization coefficient ratio k for multiplication.

At present, APDs using silicon crystals are widely employed as photo detectors in optical communications in the vicinity of a 0.8 $\mu$m wavelength region which utilize GaAs-AlGaAs system light emitting devices, but this is because silicon has as large an ionization coefficient ratio as $k=\alpha/\beta\simeq 50$ and is suitable for use in the low-noise APD. However, the Si-APD cannot be used in a 1.0 to 1.7 $\mu$m wavelength range in which transmission loss of a silica fiber employed in optical communications is low. Heretofore, Ge-APD using germanium crystals has been employed as a photo detector having effective sensitivity to a 1 $\mu$m wavelength region, but since the ionization coefficient ratio of germanium is $k=\alpha/\beta\simeq 1$, the Ge-APD suffers from large excess noise and cannot be regarded as an optimal photo detector. On the other hand, there are also under development APDs which use the III-V compound semiconductor crystals, such as InGaAsP, AlGaAsSb and so forth, and have effective photosensitivity to the 1 $\mu$m region. However, there is a limit to the decrease of noise in the APDs using such semiconductor materials in prior arts.

BRIEF SUMMARY OF THE INVENTION

It is an object of the present invention to provide an avalanche photodiode with a quantum well layer in which a thin film, periodic multilayer structure composed of two different semiconductors is formed in a carrier multiplying region, the effective ionization coefficient ratio of carriers is raised by a quantum well layer formed by the thin film, multilayer periodic structure, and only electrons of larger ionization coefficient are injected into the multiplying region, thereby to reduce noise in the APD.

In accordance with the present invention, there is provided an avalanche photodiode with a quantum well layer, comprising a first semiconductor layer for absorbing light to generate optically excited carriers; a quantum well layer formed by a thin film, periodic multilayer structure composed of second and third semiconductors for multiplying the optically excited carriers; and a pn junction interposed between the first semiconductor layer and the quantum well layer. In an avalanche photodiode with a quantum well layer of this invention, the pn junction is formed in a semiconductor layer of a large forbidden band gap different from the first semiconductor so that only electrons may be injected into the quantum well layer.

BRIEF DESCRIPTION OF THE DRAWINGS

The present invention will be described in detail below in comparison with conventional arts with reference to the accompanying drawings, in which.

DETAILED DESCRIPTION

For ready understanding of the present invention, an example of prior arts will first be described.

Figure 1:
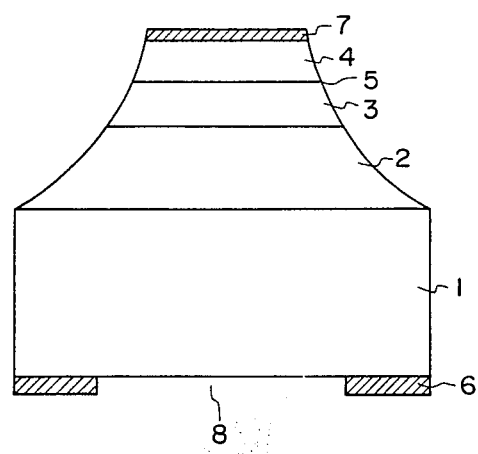
FIG. 1 is a longitudinal sectional view showing an example of a conventional avalanche photodiode.

Of these prior art examples, an APD for the 1 $\mu$m wavelength region, formed of $In_{0.53}Ga_{0.47}As/InP$, is shown in FIG. 1. In FIG. 1, reference numeral 1 indicates an n type InP substrate; 2 designates an n type $In_{0.53}Ga_{0.47}As$ layer; 3 identifies an n type InP layer; 4 denotes a p type InP layer; and 5 represents a pn junction. Light 8 of a 1 to 1.6 $\mu$m wavelength, incident on the side of the substrate, passes through the substrate and is absorbed in the $In_{0.53}Ga_{0.47}As$ layer 2 to excite carriers. The carriers excited in a reverse-biased condition in the vicinity of breakdown drift due to a high intensity electric field set up by the pn junction 5 in the InP and they are multiplied in the InP layer 4. The excess noise in this APD is dependent on the ionization coefficient ratio k of the multiplying region, that is, the InP. According to reports published so far, since the ionization coefficient ratio k of this InP, $\beta/\alpha$, is approximately equal to 2, the APD shown in FIG. 1 is low-noise as compared with the Ge-APD but apparently inferior to the Si-APD in terms of noise. Also in the III-V compound semiconductors other than the above-said InP, there is no material in which the ionization coefficient ratio k is approximately equal to that of silicon; accordingly, there is a limit to the reduction of noise in the APDs using such semiconductor materials.

Next, details of the present invention will be described in connection with its embodiment using the InP-InGaAsP alloy material.

Figure 2:
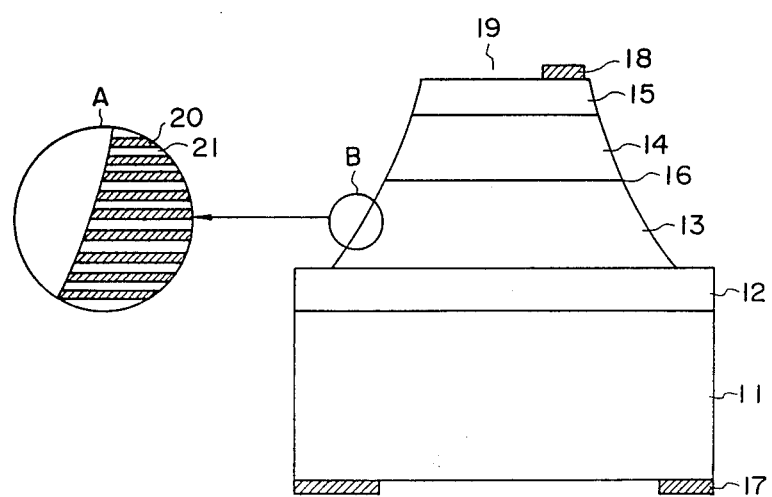
FIG. 2 is a longitudinal sectional view illustrating a first embodiment of the avalanche photodiode having a quantum well layer according to the present invention.

FIG. 2 is a cross-sectional view of a first embodiment. An n type InP layer 12 having an impurity concentration of $5\times 10^{17}$ cm$^{-3}$ and a thickness of 5 $\mu$m is formed on an n type InP substrate 11 having an impurity concentration of $1\times 10^{18}$ cm$^{-3}$, and a quantum well layer 13, which is composed of 50 n type InP layers 20 (each 400 Å thick layer) having an impurity concentration of $3\times 10^{15}$ cm$^{-3}$ and 50 n type $In_{0.53}Ga_{0.47}As$ layers 21 (each 600 Å thick layer) formed alternately with each other, is formed on the n type InP layer. Further, a p type $In_{0.53}Ga_{0.47}As$ layer 14 having an impurity concentration of $5\times 16^{16}$ cm$^{-3}$ and a thickness of 2 $\mu$m and a p type InP layer 15 having an impurity concentration of $1\times 10^{18}$ cm$^{-3}$ and a thickness of 1 $\mu$m are formed on the quantum well layer. In FIG. 2, a circle A is an enlargement of a circle B which is a part of the thin film multilayer periodic structure, and reference numerals 17 and 18 indicate metal electrodes. For the formation of such a semiconductor multilayer structure as shown in FIG. 2 on the InP substrate, use is made of a crystal growth method which is excellent in film thickness controllability, such as a molecular beam epitaxial method, a vapor epitaxial method or a vapor deposition method utilizing an organic metal. Incident light 19 having a wavelength of 1 to 1.6 μm passes through the p type InP layer 15 and is absorbed by the p type $In_{0.53}Ga_{0.47}As$ layer 14 to excite therein carriers. When a reverse bias is being applied, holes of the excited carriers flow towards the electrode 18 while electrons dirft by an electric field caused by the pn junction 16, and they are injected into the quantum well layer 13 of the thin film multilayer structure and multiplied in this high intensity electric field region.

The multiplication of the carriers by the high intensity field in such a quantum well layer 13 is described in IEE Electronics Letters, 16, P467 (1980). According to this literature, the effective ionization coefficient ratio $k = \alpha/\beta$ by the quantum well layer 13 markedly increases, for the following two reasons, as compared with the ionization coefficient ratio inherent to the material forming the quantum well layer 13.

Figure 3:
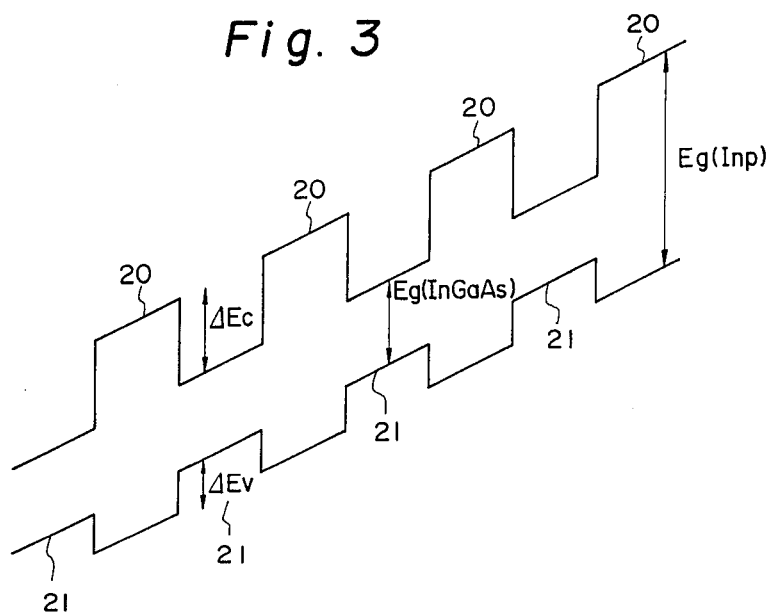
FIG. 3 is a schematic diagram showing the energy structure of the quantum well in the embodiment of FIG. 2 in a reverse biased condition.

(1) FIG. 3 is an energy band of the quantum well layer 13 of this embodiment in the reverse-biased condition, Eg(InP) and Eg(InGaAs) being the forbidden band gaps of the InP and the $In_{0.53}Ga_{0.47}As$, respectively, and $\Delta Ec$ and $\Delta Ev$ being discontinuous energies on the sides of the conduction and the valence band resulting from the difference between the forbidden band gaps of the InP and the $In_{0.53}Ga_{0.47}As$. Consequently, the relation $\Delta Ec + \Delta Ev + Eg(InGaAs) = Eg(InP)$ holds and $\Delta Ec > \Delta Ev$. The electrons injected from the InP layer 20 into the $In_{0.53}Ga0.47As$ layer 21 have the high energy $\Delta Ec$, whereas holes have a low energy $\Delta Ev$, causing an increase in the ionization coefficient $\alpha$ of the electrons.

(2) In the quantum well layer 13, the hole-hole collision increases more than the electron-electron collision and the holes are confined in the well of the valence band more than the electrons. As a result of this, ionization of the electrons effectively increases as compared with the ionization of the holes. The effective ionization coefficient ratio $k = \alpha/\beta$ in the quantum well layer 13 depends on the intervals of the individual periodic structures, the number of layers of each kind and the impurity concentration of each layer but can be set to $k = 10$ to 30.

The electrons multiplied in the quantum well layer 13 having such a large ionization coefficient ratio flow towards the electrode 17, from which an amplified current signal is delivered to an external terminal. In this case, since the ionization coefficient ratio of the quantum well layer 13 which is the multiplying region is large as described above, the excess multiplication noise is far lower than in the case of the APD using a simple III-V compound semiconductor such as InP for the multiplication.

Figure 4:
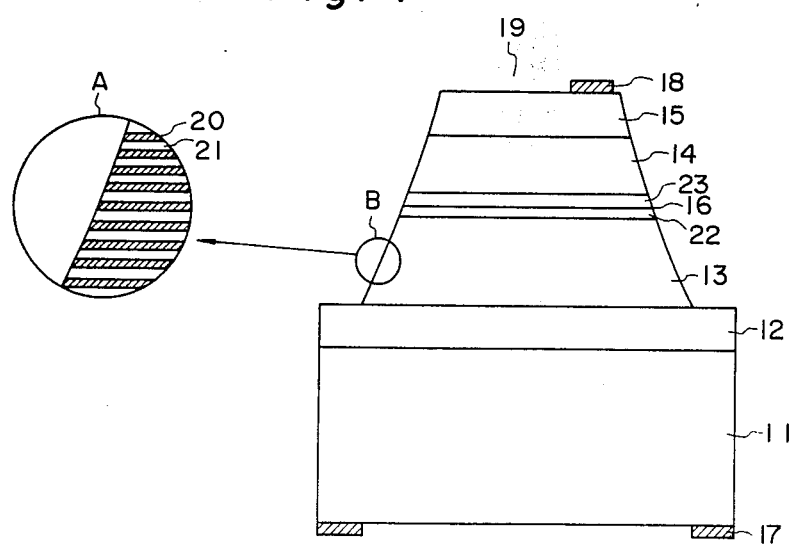
FIG. 4 is a longitudinal sectional view illustrating a second embodiment of the present invention.

FIG. 4 is a cross-sectional view illustrating a second embodiment. This embodiment differs from the first embodiment of FIG. 2 in that the pn junction provided on the quantum well layer 13 is formed by an n type InP layer having an impurity concentration $3 \times 10^{15}$ cm$^{-3}$ and a thickness of 0.5 μm and a p type InP layer 23 having an impurity concentration of $5 \times 10^{16}$ cm$^{-3}$ and a thickness of 0.3 μm. In this embodiment, since the pn junction 16 which becomes a point of the highest field intensity is defined by the InP layers 22 and 23, the field intensity which is applied to the $In_{0.53}Ga_{0.47}As$ layers 14 and 21 of small forbidden band gap is alleviated and dark current components, such as a tunnel current and a generation-recombination current in the $In_{0.53}Ga_{0.47}As$ layers, can be decreased, permitting further reduction of noise in the photo detector. Moreover, this embodiment is also identical with the first embodiment in the process of electrons being injected into the quantum well layer having a large ionization coefficient ratio and multiplied therein.

In the foregoing embodiments, it is shown that a high sensitivity and low-noise avanlanche photodiode having effective sensitivity to light of a 1.0 to 1.6 μm wavelength can be obtained by using the $In_{0.53}Ga_{0.47}As$ layer as a region for absorbing light and for exciting carriers and by using the quantum well layer composed of the $In_{0.53}Ga0.47As$ layer and the InP layer as a region for multiplying the electrons injected thereinto. However, the present invention is also applicable to the other III-V compound semiconductors, AlGaAs-GaAs, AlInGaAs-InP, InGaAsP-InP, AlGaAsSb-GaSb systems. Furthermore, it is also possible to employ semiconductors reverse in conductivity type from those used in the embodiments. Moreover, the embodiments have been described in respect of APDs of the mesa structure, but a planar structure can also be employed.

As has been described in the foregoing, according to the present invention, a large ionization coefficient ratio which could not have been obtained with a simple III-V compound semiconductor is obtained through the use of the quantum well layer, and only electrons are injected into the quantum well layer used as a multiplying region, so that an extremely low-noise avalanche photodiode can be obtained; therefore, the present invention is of great utility when employed in optical communications and so forth.

What we claim is:

1. An avalanche photodiode with a quantum well layer, comprising a first semiconductor layer for absorbing light of wavelight of 1.0 to 1.6 mm to generate optically excited carriers; a quantum well layer formed by a thin film, periodic multilayer structure composed of second semiconductors of InP and third semiconductors of $In_xGa_{1-x}As$ for multiplying the optically excited carriers; and a pn junction interposed between the first semiconductor layer and the quantum well layer.

2. An avalanche photodiode with a quantum well layer according to claim 1, wherein the pn junction is formed in a semiconductor n-type InP layer of a forbidden band gap wider than that of the first semiconductor and by a p-type InP layer so that only electrons may be injected into the quantum well layer.

3. An avalanche photodiode with a quantum well layer, comprising a first semiconductor layer for absorbing light of wavelength of 1.0 to 1.6 mm to generate optically excited carriers; a quantum well layer formed by a thin film, periodic multilayer structure composed of second semiconductors of InP and third semiconductors of $In_xGa_{1-x}As$ for multiplying the optically excited carriers; and a pn junction interposed between the first semiconductor layer and the quantum well layer, the pn junction being formed by a fourth semiconductor layer (23) having a forbidden band gap larger than that of the first semiconductor layer (14), and by a fifth semiconductor layer (22) of a conductivity-type different from that of the fourth semiconductor layer (23) and having a thickness less than that of the first semiconductor layer (14) and having a forbidden band gap wider than that of the first semiconductor layer (14).

4. An avalanche photodiode with a quantum well layer comprising, an n-type -InP substrate, a first semiconductor layer for absorbing light of wavelight of 1.0 to 1.6 um to generate optically excited carriers; a quantum well layer formed by a thin film, periodic multilayer structure composed of second semiconductor layers of InP and third semiconductors of $In_xGa_{1-x}As$ alternately disposed with the second semiconductor for multiplying the optically excited carriers; and a p-n junction interposed between the first semiconductor layer and the quantum well layer.

* * * * *